United States Patent [19]

Bollons

[11] Patent Number: 4,988,953
[45] Date of Patent: Jan. 29, 1991

[54] AMPLIFIERS WITH EFFECTIVELY ZERO INPUT CAPACITANCE

[75] Inventor: Bernard Bollons, Stratford-upon-Avon, United Kingdom

[73] Assignee: ABI Systems Limited, United Kingdom

[21] Appl. No.: 366,667

[22] Filed: Jun. 14, 1989

[30] Foreign Application Priority Data

Jun. 14, 1988 [GB] United Kingdom ............... 8814091

[51] Int. Cl.$^5$ ..................... H03F 3/04; G01L 9/12
[52] U.S. Cl. ..................... 330/261; 73/724; 324/663; 330/297; 331/65
[58] Field of Search ............... 330/156, 202, 261, 297; 73/718, 724; 324/60 C, 60 CD, 61 R; 331/65, 108 D; 361/283

[56] References Cited

FOREIGN PATENT DOCUMENTS 1020286 11/1962 United Kingdom.
1142894 9/1966 United Kingdom.
1213110 7/1969 United Kingdom.
1339933 9/1971 United Kingdom.
2038127 12/1979 United Kingdom.
2069269 1/1981 United Kingdom.

OTHER PUBLICATIONS

Del Curso et al., "Simple Circuit to Double the Output-Voltage Swing of an Operational Amplifier with Increased Slew Rate", *Electronics Letters*, Mar. 23, 1972, vol. 8, No. 6, pp. 151, 152.

Thomas, "Input Capacitance Feedback Improves Neutralization", *Electronics*, Jan. 20, 1977, pp. 112, 113.

"Electronics" by Dale R. Younge, dated: Oct. 28, 1968, pp. 90 & 91.

*Primary Examiner*—James B. Mullins
*Attorney, Agent, or Firm*—Davis, Bujold & Streck

[57] ABSTRACT

An amplifier includes a first integrated circuit differential amplifier, the output of the first differential amplifier being fed back to its inverting input, an input is applied to its non-inverting input and second and third differential amplifiers are provided in the positive and negative supply line by which the input signal to the first differential amplifier may be imposed on the positive and negative supplies, so that the input capacitance of the first differential amplifier is effectively zero.

6 Claims, 2 Drawing Sheets

AMPLIFIERS WITH EFFECTIVELY ZERO INPUT CAPACITANCE

BACKGROUND OF THE INVENTION

The present invention relates to amplifiers and to circuits including such amplifiers.

Modern integrated circuit differential amplifiers exhibit very high input impedance and very low drift with variation in temperature. Buffer amplifiers are conventionally formed from a differential amplifier configured as a voltage follower in which the output of a differential amplifier is connected to the inverting input and an input signal is applied to the non-inverting input.

However, with integrated circuit differential amplifiers, because of inherent inter-track capacitance imposed by the physical makeup of the circuit, the differential amplifier will have an input capacitance, typically 1.5 pF. This input capacitance is due, in the main, to capacitive coupling between the non-inverting input and the positive and negative supply lines.

This input capacitance does not normally present any problem when the amplifier is used in conventional applications. However for very specialised designs, e.g. precision capacitance measuring systems this small input capacitance will cause unacceptable non-linearities, therefore an amplifier with zero input capacitance is desirable.

The present invention provides an amplifier with effectively zero input capacitance.

SUMMARY OF THE INVENTION

According to one aspect of the present invention an amplifier comprises a first integrated circuit differential amplifier, the output of the differential amplifier being fed back to its inverting input, an input being applied to its non-inverting input and means being provided in the positive and negative supply lines by which the input signal to the differential amplifier may be imposed on the positive and negative supplies.

By imposing the input signal on the positive and negative supplies in the manner described above, the positive and negative supplies will rise and fall with the input and consequently there will be no current to charge the capacitive coupling therebetween and as a result the input capacitance of the amplifier will be effectively zero.

The amplifier described above is particularly suitable for producing a capacitance to frequency converter.

According to one further aspect of the present invention a capacitance to frequency converter comprises an amplifier (as hereinbefore defined) the output of the first differential amplifier being connected to the inverting input of a further integrated circuit differential amplifier, the further differential amplifier being configured as a Schmitt trigger, common positive and negative voltage supplies being applied across the first and further differential amplifiers.

BRIEF DESCRIPTION OF THE DRAWINGS

Various embodiments of the invention are now described, by way of example only, with reference to the accompanying drawings, in which.

DESCRIPTION OF A PREFERRED EMBODIMENT

Figure 1:
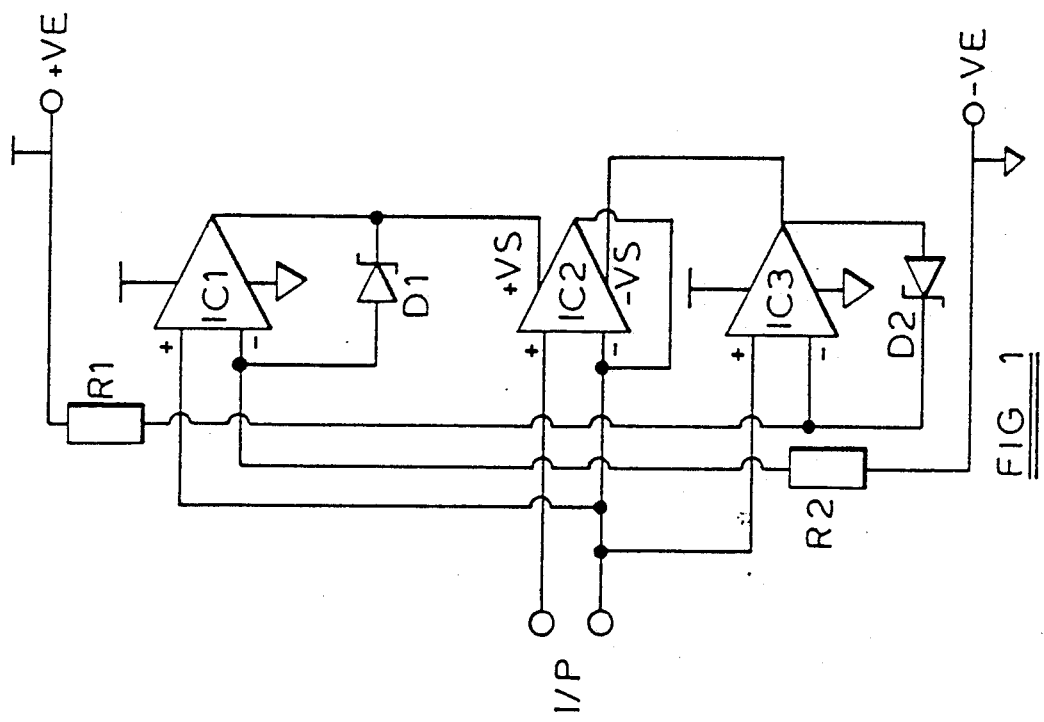
FIG. 1 shows a circuit diagram of a buffer amplifier formed in accordance with the present invention.

As illustrated in FIG. 1 a buffer amplifier comprises a differential amplifier IC2, the output of which is connected to its inverting input. The output from the differential amplifier IC2 is also connected to the non-inverting inputs of second and third differential amplifiers IC1 and IC3. The outputs of IC1 and IC3 are fed back to their inverting inputs via zener doides D1 and D2 respectively. The inverting input of amplifier IC1 is connected to the negative voltage source (−VE) via resistance R2 and the inverting input amplifier IC3 is connected to the positive voltage source (+VE) via resistance R1. The positive voltage supply (+VS) to amplifier IC2 is taken from the output of amplifier IC1 while the negative voltage supply (−VS) is taken from the output of amplifier IC3. An input signal to the buffer amplifier is applied to the non-inverting input of amplifier IC2.

With this circuit, there is feedback action which causes the inverting inputs of amplifiers IC1 and IC3 to track the output of amplifier IC2. The network R2,D1 ensures that the zener diode D1 is conducting at its reference voltage and therefore that the output of amplifier IC1 will be more positive than the output of amplifier IC2 by the reference voltage of zener diode D1. Similarly, the output voltage of amplifier IC3 will be more negative than the output of amplifier IC2 by the reference voltage of zener diode D2.

Consequently a constant voltage supply equal to sum of the reference voltages of zener diodes D1 and D2 will be applied across the amplifier IC2, but the positive and negative supplies (+VS) and (−VS) will go up and down with the input signal. As a result, there will be no variation of potential between the input signal of IC2 and its supply connections, therefore there will be no signal current charging the input capacitance which exists between the input of the amplifier IC2 and its supply connections The proposed circuit consequently avoids the input capacitance which is inevitable with conventional integrated circuit differential amplifiers.

Figure 2:
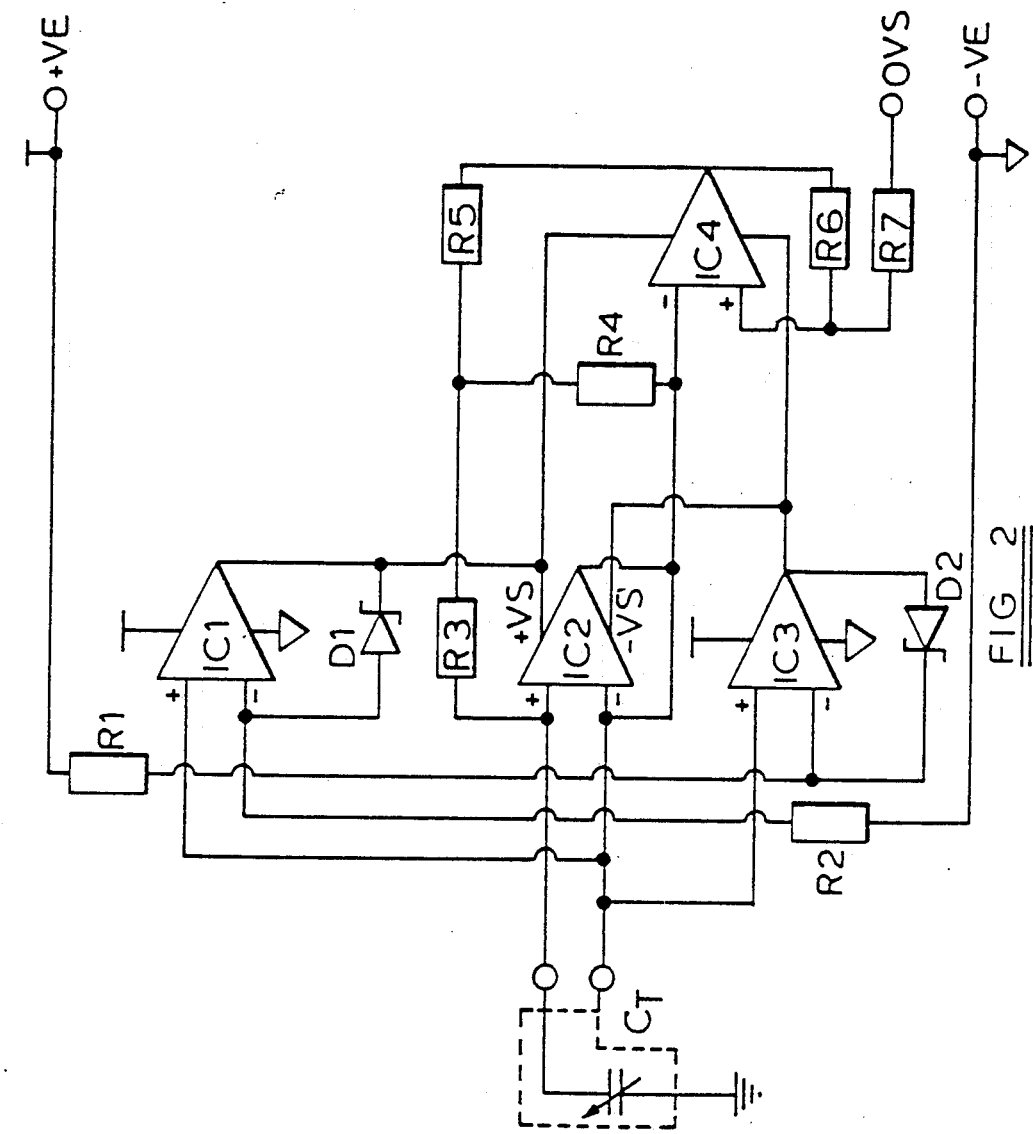
FIG. 2 shows a circuit diagram of a capacitance to frequency converter based on the buffer amplifier shown in FIG. 1.

In the capacitance to frequency converter illustrated in FIG. 2, the output from differential amplifier IC2 of the buffer amplifier illustrated in FIG. 1, is connected to the inverting input of a further differential amplifier IC4. The output from amplifier IC4 is connected to; the non-inverting input of amplifier IC4 via resistance R6, the non-inverting input for amplifier IC2 via resistances R3 and R5, the inverting input of amplifier IC4 via resistances R4 and R5 and to a zero voltage supply (0VS) via resistances R6 and R7. The non-inverting input of amplifier IC4 is connected to the zero voltage supply (0VS) via resistance R7.

An output is taken from between the output of amplifier IC4 and the zero voltage supply (OVS) and an input, for example from a variable capacitive device Ct, is applied to the non-inverting input of IC2. The inverting input of IC2 may be connected to a screen of the input cable. The positive and negative supplies to amplifier IC4 are taken from the outputs of amplifiers IC1 and IC3 respectively.

The amplifier IC4 is configured as a Schmitt Trigger. The output of IC4 will always be either hard positive (+VS) or hard negative (−VS). Consequently a fraction of either the positive or negative supplies (+VS) or (−VS), will always appear across resistance R4. Since the output of amplifier IC2 will be at the same potential as the input, a constant voltage will be imposed on resistance R3 and therefore a constant current (I) will flow through resistance R3. This constant current will charge capacitive device Ct and hence a voltage ramp will occur at the output of amplifier IC2. Amplifier IC4 will toggle from the positive supply voltage (+VS) to the negative supply voltage (−VS) as the ramp reaches the limit of the hysteresis of amplifier IC4 and hence the whole circuit will oscillate at a frequency defined by the expression:

$$F = I/2Ct[R6/R6+R7][(+VS)-(-VS)]$$

The frequency will consequently be inversely proportional to the capacitance Ct.

The above capacitance to frequency converter is particularly suitable for use with a displacement capacitive device, in which a pair of plates are mounted such that one plate is connected to the input of the capacitance to frequency converter and the other is spaced a small distance away and connected to the zero voltage supply (OVS). A small capacitance will now exist between the two plates, typically 1–2 pF. The plate connected to the zero voltage supply (OVS) can be made to move relative to the other plate when for example subjected to load or pressure.

Figure 3:
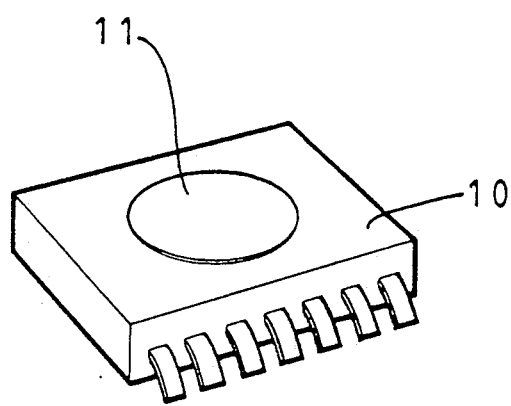
FIG. 3 is a diagrammatic view of an integrated circuit and monolithic component.

The buffer amplifier or capacitance to frequency converter described above may be made from discrete components or may themselves be in the form of integrated circuits. If an integrated circuit capacitance to frequency converter is used in a displacement capacitive device of the form disclosed above, one of the plates 11 may itself be built on to the surface of the integrated circuit 10 to form a monolithic component as illustrated in FIG. 3. The other plate of the displacement capacitive device may then be provided by a conductive element which is deformable under a load applied thereto. This element may, for example, be the wall of a casing of a load cell or pressure transducer.

I claim:

1. An amplifier comprising a first integrated circuit differential amplifier, an input being connected to the noninverting input of said first amplifier; the output of said first amplifier being connected to its inverting input and to the non-inverting inputs of a second and third differential amplifier; the inverting input of the second differential amplifier being connected to a negative voltage source and its output being connected to the positive voltage supply of said first differential amplifier; the inverting input of the third differential amplifier being connected to a positive voltage source and its output being connected to the negative voltage supply of said first differential amplifier; a first zener diode being connected between the inverting input and output of the second differential amplifier and a second zener diode being connected between the inverting input and output of the third differential amplifier, the sum of the reference voltages of the zener diodes being equal to the supply voltage applied across said first differential amplifier.

2. An amplifier according to claim 1 in which the inverting input of the first differential amplifier is connected to a screen of a lead applying an input signal to the non-inverting input.

3. A capacitance to frequency converter comprising an amplifier as claimed in claim 1, the output of the first differential amplifier being connected to the inverting input of a further integrated circuit differential amplifier, the further differential amplifier being configured as a Schmitt Trigger, common positive and negative voltage supplies being applied across the first and second differential amplifiers.

4. A capacitance to frequency converter according to claim 3 in which the output of the further differential amplifier is connected to; the non-inverting input of the first differential amplifier via first and second resistances, its inverting input via the first and a third resistance and its non-inverting input via a fourth resistance; and the non-inverting input of the further differential amplifier is connected to a zero voltage supply via a fifth resistance.

5. A displacement capacitance device comprising a pair of plates mounted so that one is movable relative to the other and a capacitance to frequency converter as claimed in claim 3.

6. A displacement capacitance device comprising a pair of plates mounted so that one is movable relative to the other and a capacitance to frequency converter, in which one of said plates is built on to the surface of an integrated electronic circuit, in accordance with claim 3, to form a monolithic component.

* * * * *